United States Patent [19]

Schwartz

[11] 4,246,649
[45] Jan. 20, 1981

[54] PHASE CONTROLLED GATING

[75] Inventor: Sidney J. Schwartz, Vista, Calif.

[73] Assignee: Burroughs Corporation, Detroit, Mich.

[21] Appl. No.: 18,511

[22] Filed: Mar. 8, 1979

[51] Int. Cl.³ .............................................. G11C 19/08
[52] U.S. Cl. .................................... 365/16; 365/13
[58] Field of Search ............................... 365/5, 13, 16

[56] References Cited

U.S. PATENT DOCUMENTS

| 3,876,995 | 4/1975 | Clover et al. | 365/16 |
| 4,094,005 | 6/1978 | Chen | 365/16 |

Primary Examiner—Vincent P. Canney
Attorney, Agent, or Firm—Joseph R. Dwyer; Charles J. Fassbender; Kevin R. Peterson

[57] ABSTRACT

In a magnetic bubble (domain) memory chip, transfer gating circuits of propagate elements oriented to be responsive to different phases of in-plane rotating magnetic field are operated by a single conductor which is subjected to current pulses during a specific phase of the rotating field cycle to transfer bubbles onto different bubble paths. The transfer gates perform their gating function only when a control current pulse occurs during a specific phase of the rotating field cycle and are unresponsive to the current pulses at other phase times on the same conductor which actuate other gates.

9 Claims, 8 Drawing Figures

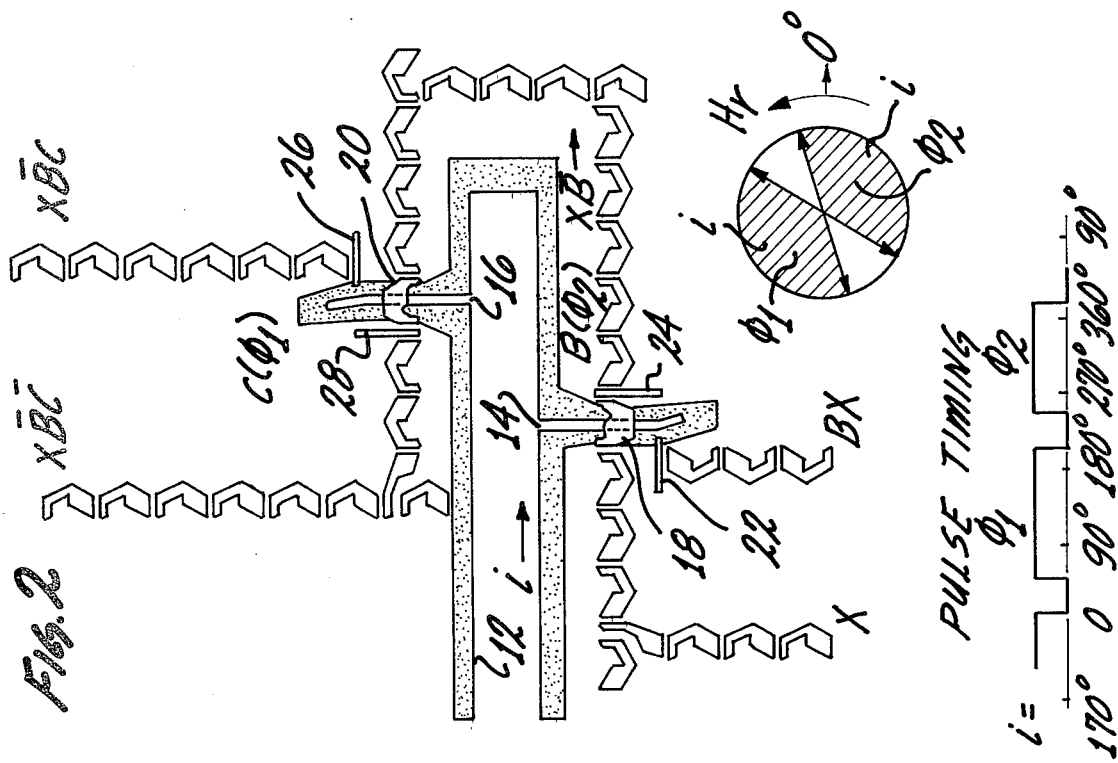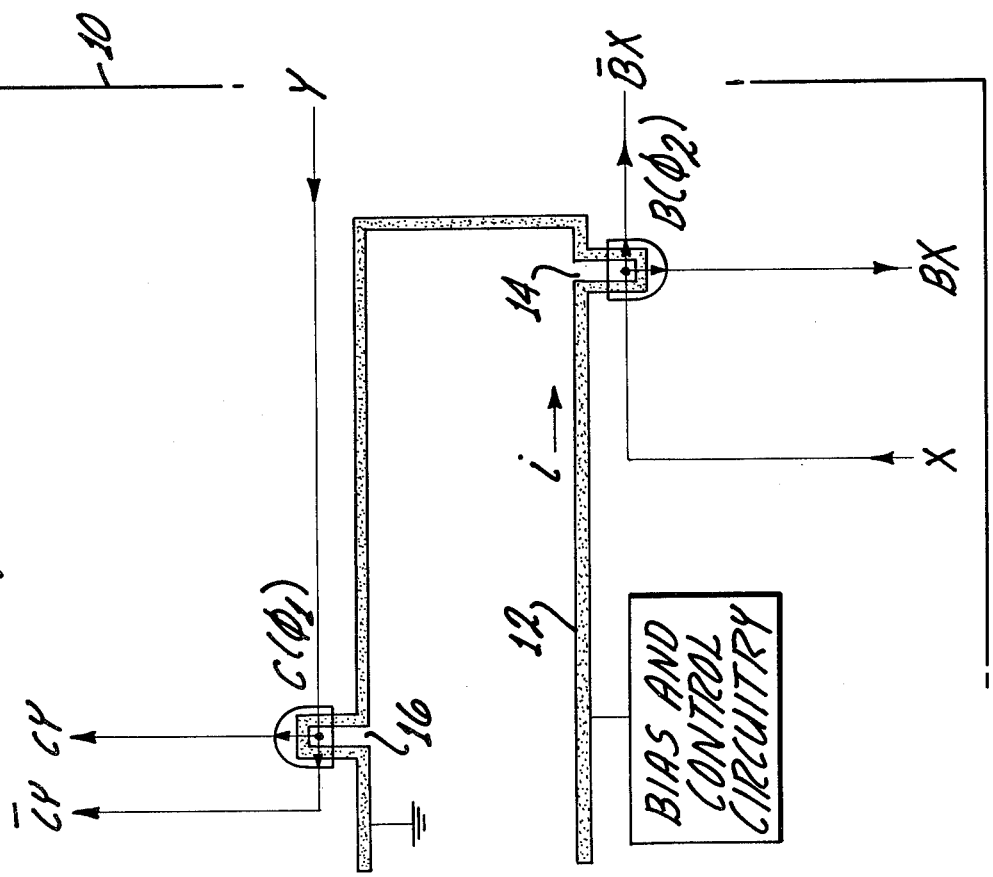

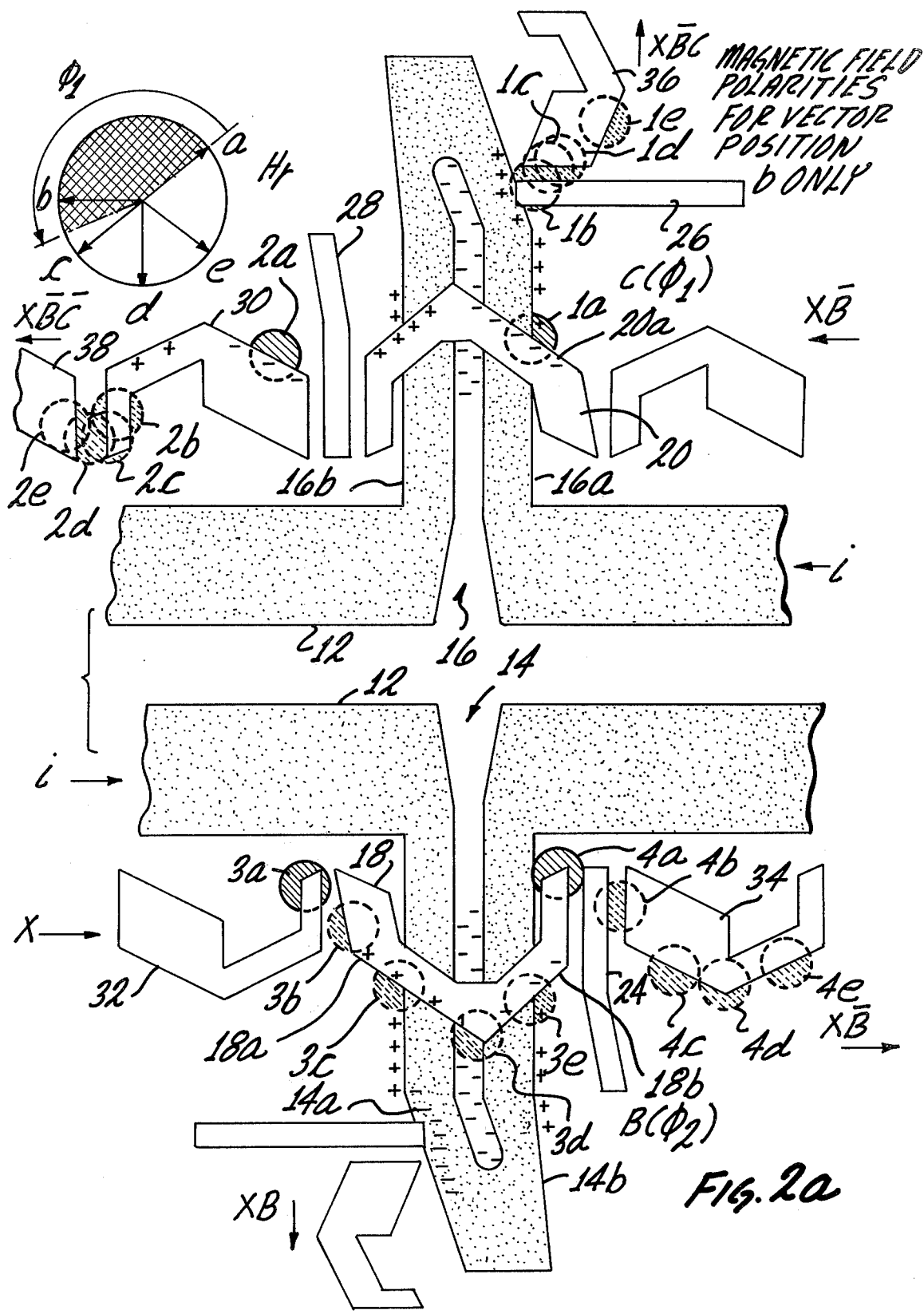

INITIAL POSITION T=0

PHASE CONTROLLED GATING

CROSS REFERENCE TO RELATED APPLICATIONS

U.S. patent application for Letters Patent entitled "Phase Controlled Decoder for Bubble Memories" by Sidney J. Schwartz Ser. No. 018,513 and "Phase Controlled Replicate/Swap Gate for Bubble Memories" by Sidney J. Schwartz Ser. No. 018,512.

BACKGROUND OF THE INVENTION

This invention is directed to magnetic bubble (domain) devices and, in the broadest sense, is directed to devices for manipulating streams of magnetic bubbles representing data. More specifically, this invention is directed to a new and improved gating device for transferring information, in the form of magnetic bubbles, between various data paths.

Magnetic bubble domain devices (chips) are now well-known in the art. These chips have means for forming and supporting bubbles under a suitable bias field and for propagating bubbles on patterns of propagate elements serially, as a stream, in response to an in-plane rotating magnetic field.

Also, utilization of gating devices which transfer bubbles from one data path to another in response to current applied to a control gate conductor associated with the gate is also old.

Currently, development is directed toward optimizing the bubble devices to reduce their cost and to increase their capacity and it is towards this object that this invention is directed.

SUMMARY AND ADVANTAGES OF THE INVENTION

The gating circuitry which comprises this invention is formed of propagate elements arranged such that two or more gates differently oriented are operated by a single conductor which are subjected to current pulses during specific phases of the rotating in-plane magnetic field cycle. Thus, the transfer gates are arranged to perform their gating function only when the control current pulse occurs during a specific phase of the rotating field cycle and do not perform a gating function if the control current pulse occurs during other phases of the rotating in-plane magnetic field. A multiplicity of gates may be simultaneously activated at each operating phase by coupling them to the control conductor.

From the foregoing, it will be apparent that this gating circuitry, wherein gates of two logic definitions can be independently actuated by one control conductor, reduces the number of conductor circuits required on certain bubble chips. This has the advantage of cost reduction and some simplicity in the operation of the chips. The cost reduction results from the fact that less space is used on the chips for metallization (conductor) runs and less bonding pads are required. A further cost reduction results because the drive circuit, is serving multiple functions, thus eliminating some electronic components from the memory system.

Additional advantages will be apparent to those skilled in the art after a reading of the following description of the preferred embodiment and after a study of the accompanying drawings.

BRIEF DESCRIPTION OF THE DRAWINGS

FIG. 1 is a schematic illustration of the phase controlled gating circuit constructed in accordance with the teachings of this invention;

FIG. 2 is a specific embodiment of the phase controlled gating circuit showing propagate elements arranged as in the schematic of FIG. 1;

FIG. 2a is an enlarged view of a position of the transfer gates of FIG. 2 to illustrate the relationship of the current conductor, the transfer elements, and the path of the bubble during one phase.

DESCRIPTION OF THE PREFERRED EMBODIMENT

Figure 3A:
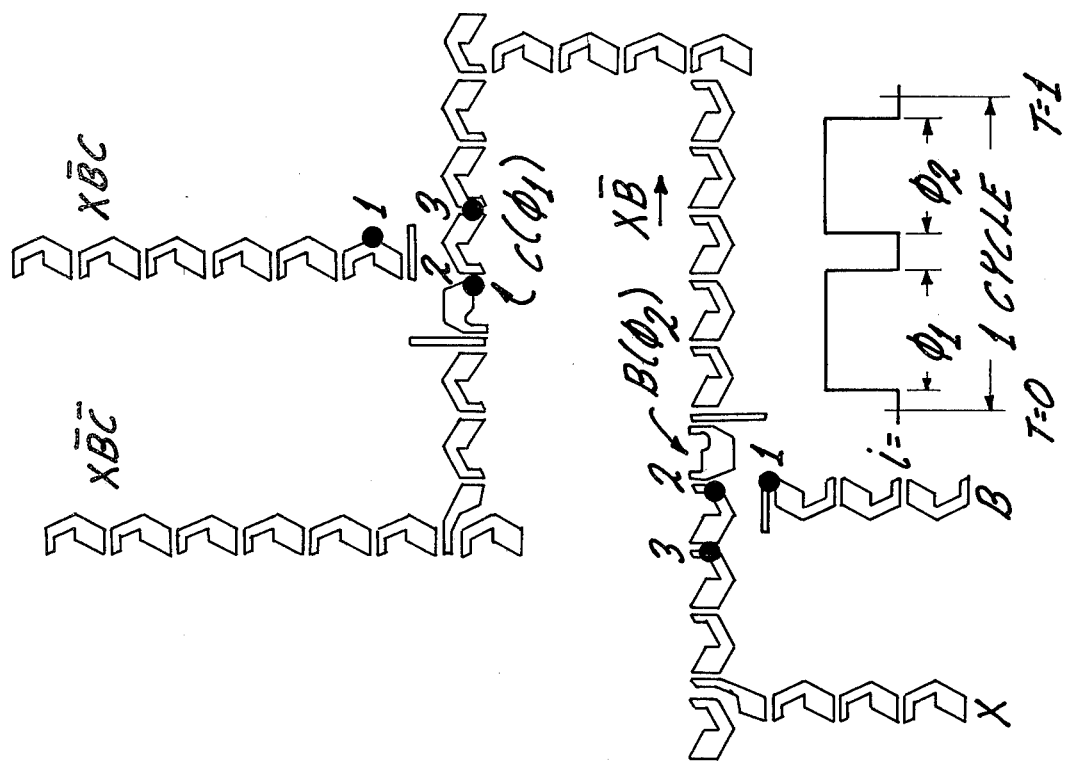
FIGS. 3 and 3a–d illustrate the operation of the transfer gates and the position of individual bubbles being transferred to different data paths at time T=0 to time T=1.

In FIG. 1, there is shown a schematic representation of the present invention. In this embodiment, there are shown two lines X and Y representing propagation paths for bubble streams to two transfer gates B and C on a bubble memory chip 10. The bubble chip 10 is conventionally formed of suitable material on which conditions exist for establishing single wall domains with magnetically soft propagate elements organized in tracks or patterns, such as X and Y, and in patterns including storage loops together with suitable bias sources, control circuits and in-plane magnetic field sources for domain propagation.

Gate B has two output bubble paths B X and $\overline{B}$ X and gate C has two output paths C Y and $\overline{C}$ Y. The two gates are alike but are oriented differently on the chip. Gate B is pointed downwardly (as shown in the drawings) while gate C is pointed upwardly, i.e., 180° positional opposition.

A single gate control conductor 12 is shown as a wide line connected to both gates and to a suitable source of current shown as a block diagram entitled "Bias and Control Circuitry." When the gate control conductor is pulsed with a current, a field is provided for transferring the bubbles at each gate. The specific routing of the current conductor 12, such as loops 14 and 16 at gates B and C, respectively, will depend upon the actual conductor form to be used with the specific pattern of elements forming each of the gates.

In the embodiment shown, a bubble on line X flows to gate B and will pass through gate B to gate output path $\overline{B}$ X unless a control current pulse appears on the conductor 12 during phase 2 time in the rotating field cycle (the phases of the cycle will be explained in more detail with the actual embodiment shown in FIG. 2). If the conductor is pulsed during phase 2 time of the cycle, a bubble at gate B will be directed to follow the path B X. Similarly, a bubble on line Y entering gate C, will be directed onto the output path C Y, if a current pulse is applied to the gate during the phase 1 time of the cycle. On the other hand, if a current is not applied to gate C during the phase 1 time, the bubble will pass through the gate to the $\overline{C}$ Y output.

Turning now to FIG. 2, there is shown a portion of an actual bubble propagation circuit containing two transfer gates, again labelled B and C, and where the bubble paths are defined the permalloy propagate elements of a selected shape on which the bubbles propagate element-to-element in response to the counter-clockwise rotating in-plane magnetic field $H_r$. The connection to the source of current and the bias and control circuitry has been omitted in this Figure for clarity of disclosure. In this Figure, the $\overline{B}$ output of the gate B is connected to the input to gate C and the output paths from gate C are labelled X $\overline{B}$ $\overline{C}$ and X $\overline{B}$ C to reflect this interconnection. The selected propagate elements forming the bubble paths are of the asymmetrical chevron type and are essentially identical except where the loops 14 and 16 are located. Spanning the loops 14 and 16 are propagate elements 18 and 20, respectively, as one form of transfer elements, with pick-off bars 22–28 enabling the bubbles to bridge the gap in the desired direction when leaving the transfer element in response to the in-plane rotating magnetic field and a current pulse on conductor 12. Also, the loops 14 and 16 are, of course, beneath the propagate elements in the conventional matter and, again, the loops point in a direction consistent with the schematic of FIG. 1.

Also, in connection with this Figure, it is noted, that the 360° counter-clockwise rotation of the in-plane magnetic field is represented by a circle starting with a horizontal 0° and, phase 1 and phase 2, represented by the Greek symbol $\phi$, are shown to span more than 90° in each of the hemispheres of the circle. This span is also represented by the timing diagram with the current pulses i for the two phases. Again, bubbles from a source of bubbles, which can be a nucleator, a major or minor storage loop or other tracks, propagate along a path X to enter transfer gate B. If a pulse occurs on conductor 12 during the phase 2 period, the bubble in gate B will be transferred to the X B output path. The absence of a current pulse during phase 2 will allow the bubble to pass straight through the gate B towards gate C. When this latter bubble arrives at gate C after another 12 rotations of the in-plane magnetic field (corresponding to the number of propagate elements connecting gate B to gate C after passing through gate B), a current pulse on the conductor 12 during phase 1 will transfer the bubble to the X $\overline{B}$ C output path of gate C. If no current pulse occurs during phase 1, then the bubble will pass straight through gate C to the X $\overline{B}$ $\overline{C}$ output.

FIG. 2a is an enlarged and more detailed view of a portion of FIG. 2, having the basic purpose to show the situation where a bubble is to be transferred during phase 1 at gate C whereas bubbles are not to be transferred at the gate B during this same phase 1. The same current i and its direction is shown together with a vector diagram indicating phase positions a, b, c, d and e and bubbles 1, 2, 3 and 4 appearing at different portions of the two transfer gates B and C and adjacent bit positions. The suffixes a, b, c, d and e to the bubble number 1, 2, 3 and 4 correspond to the phase positions a, b, c, d and e of the vector diagram.

It should be noted here, parenthetically, that the transfer elements 18 and 20, shown an chevrons in this Figure, are functionally the same as transfer elements 18, 20 shown in FIG. 2 and subsequent Figures. Also, by definition, a positive magnetic field direction is that which will support, or attract, a bubble and is represented by the plus signs (+) while negative signs (−) represent a negative field direction which would oppose or collapse a bubble. Both field directions are shown located on the transfer elements 18 and 20 and adjacent the legs 14a and 14b and 16a and 16b which make up the conductor loops 14 and 16. It must be pointed out at this time, however, that the magnetic field polarities + and − are shown at phase direction b only as shown in the vector diagram.

At the starting time, phase direction a, indicated by the bubble position 1a, bubble 1 is approaching an edge of leg 16a and the current i is causing a positive field direction along the edges of the conductor. On the next chevron element 30, after the transfer gate C, a bubble 2 is shown at position 2a and is already beyond the influence of the conductor at this time. Since the conductor is only being pulsed during phase 1, as shown in the vector diagram, the gate B (phase 2) will allow a bubble to pass through the transfer element 18 without being transferred to track X B so that bubble 3 is in position 3a on element 32 and is about to be transferred to the end of the transfer element 18 by the rotating field $H_r$. Bubble 4 is at position 4a and is being held there by a strong pole at the end of element 18.

At the time the field is rotated to direction b, the pick-off bar 26 has attracted bubble 1 to position 1b due to the attractive field direction along the edge of segment 16a of the conductor which allows the bubble to slide from position 1a to position 1b assisted by the attractive strong pole forming on the pick-off element 26. Also at this time, the right sloping edge 20a of transfer element 20 has become partially negative which helps to repel the bubble up along the conductor towards the element 26.

On element 30, bubble 2 has propagated around the element and has moved to position 2b in a normal propagation manner. On transfer element 18 of gate B, bubble 3 has crossed the gap between element 32 and transfer element 18 and resides on the left side of the element 18 and bubble 4 has crossed the gap between pick-off bar 24 and element 34 and is now moving along the left side of element 34. The current i causes a negative field region in the gap between the two legs 14a,b and 16a,b forming the loops 14 and 16 both in gate C and gate B and this is a further barrier or, offers a potential hill, preventing bubble 1 from sliding up to the tip of transfer element 20 and around the element.

When phase direction c is reached, bubble 1 has moved to position 1c and is now totally on element 36. Bubble 2 has moved toward the direction of the gap between element 30 to the next element 38 as shown in position 2c. Bubble 3 at position 3c is moving along the left sloping side 18a of transfer element 18 due to the attractive pole situation of the rotating field on element 18. Note, that by the time phase direction c is reached, the current i has been turned off in the conductor 12. (There is no pulse in the conductor during phase 2 in this example of the operation of this device.) Since the current has now been turned off, there is no positive field situation along the conductor leg 16a to assist bubble 3 in sliding over to pick-off bar 22. The poles on element 18 maintain a strong attraction for bubble 3.

At vector position d, bubble 1 has moved to position 1d still at the bottom of element 36, bubble 2 is in the gap cross-over position on element 30, position 2d, bubble 3 has now moved to the point on element 18, the lower most position, on element 18 at position 3d, being able to move there because there is no blocking current on the conductor, and bubble 4 has moved to the downward pointing position on the tip of element 34, position 4d. Later at field vector position e, bubble 1 is moved further up element 36 to position 1e, bubble 2 has now crossed the gap between elements 30 and 38 and is on element 38 in that path X $\overline{B}$ C, bubble 3 is sliding up the right slope side 18b of element 18 to position 3e and bubble 4 has moved along the upward slope 34a of the element 34 to position 4c.

Thus, there has been disclosed a complete phase controlled transfer, i.e., from path X B̄ to path X B̄ C, through one transfer gate and no transfer at the other gate, i.e., no transfer from path X to path X B but a continuation through gate B to path X B̄, during a particular cycle of the in-plane magnetic field. By reason of symmetry, the situation could be reversed for a transfer at gate B and none at gate C during phase 2 and not phase 1. It is to be noted that when both the gates are to be in a transfer function, the current pulse is on with a cessation for a period between phases 1 and 2 to allow the influence of the conductor on the bubbles to be severed.

Figure 3:
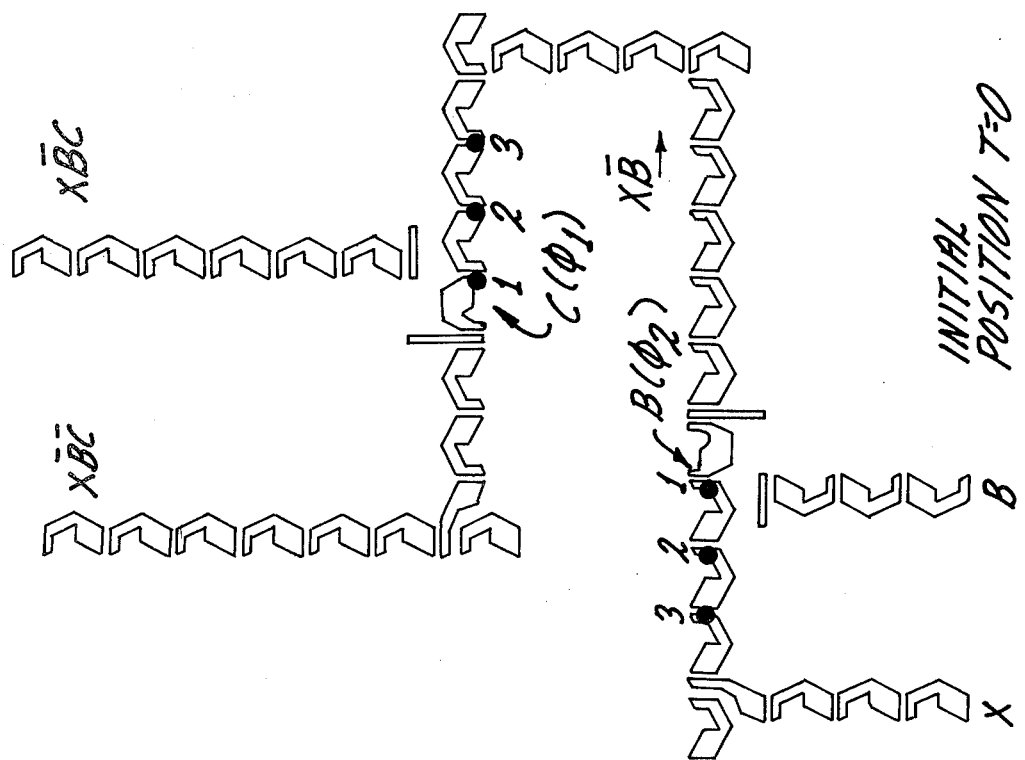

Turning now to FIG. 3, 3 identifies the bubble positions at time T=0. Bubble positions moved on FIG. 3 to be consistant with 0° definition on FIG. 2.

It should be noted at the outset, that FIGS. 3 and 3a-d are not continuous timing diagrams but are diagrams representing the position of the bubbles one cycle after T=0, at T=1, for each of the possible combinations of current pulse phases that can occur during one cycle.

In these Figures, FIG. 3 represents the initial position of three bubbles identified as 1, 2 and 3 both located adjacent transfer gates B and C. For the sake of clarity, the conductors are eliminated in these Figures. FIG. 3a shows the bubble positions at T=1 as a result of the current pulse during both phase 1 and phase 2 as illustrated in the timing diagram occurring during one 360° cycle of the rotating in-plane magnetic field from time T=0 to time T=1. As a result, bubble number 1 adjacent gate B has been transferred to the X B track and bubble number 1 adjacent the C gate has been transferred to the X B̄ C track.

Figure 3C:
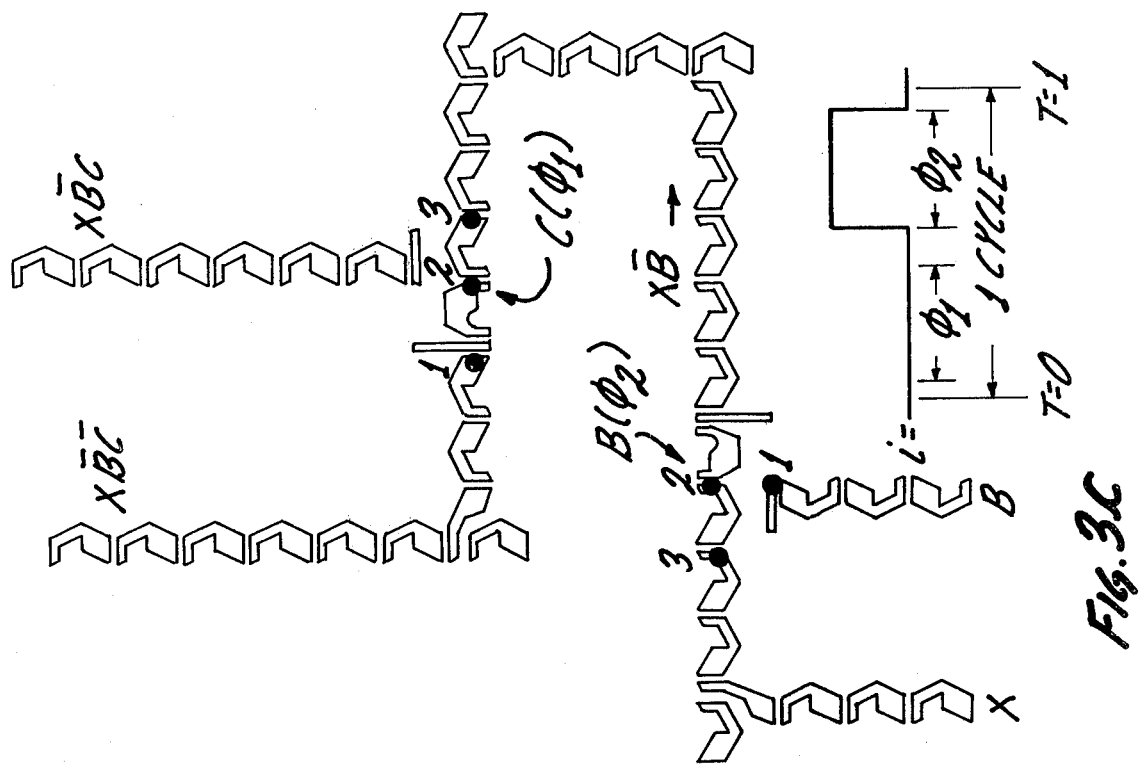
Figure 3B:
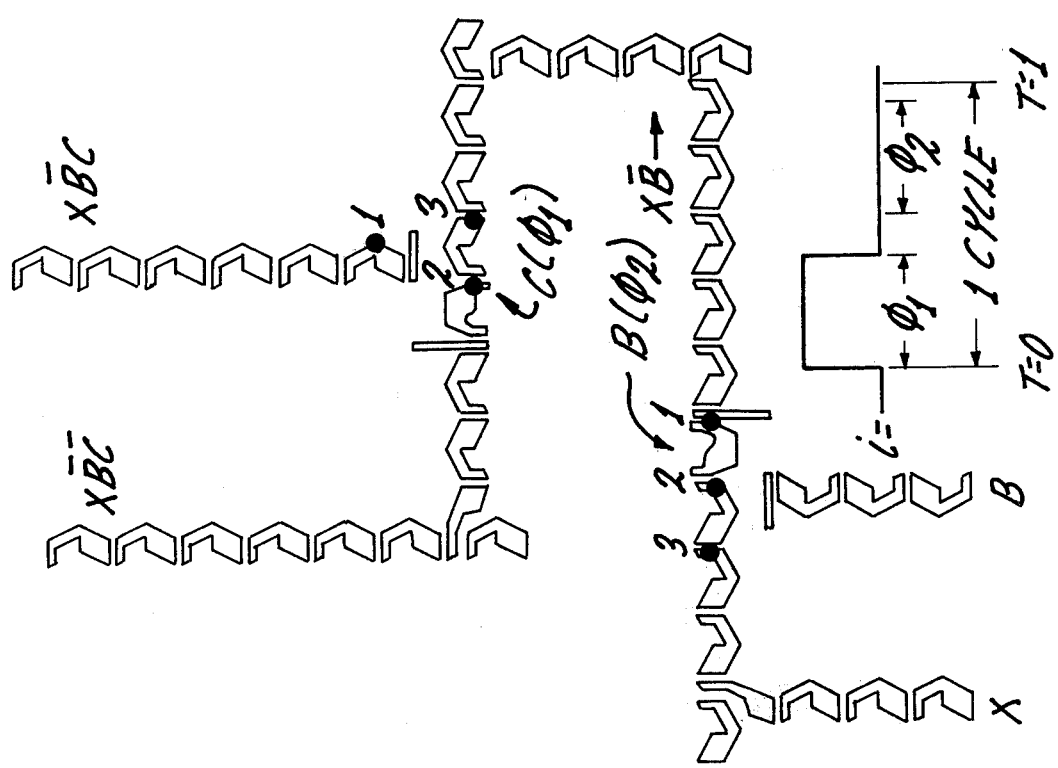

Consider now FIG. 3b together with FIG. 3 showing the bubbles in the position at T=0. In this case, according to the timing diagram, during one cycle of the rotating in-plane magnetic field, a pulse occurred on phase 1 but no pulse occurred on phase 2. This shows that bubble number 1 at gate B passed on over to the X B̄ track and, of course, bubbles 2 and 3 each propagated one element. On the other hand, since a pulse did occur in phase 1, bubble number 1 at gate C was transferred to the X B̄ C track, while bubbles 2 and 3 each propagated one element, as before.

Now considering FIG. 3c and its accompanying timing diagram, in combination with FIG. 3 at T=0, this Figure shows what occurs when there is no pulse at phase 1 but there is a pulse during phase 2. In this case a bubble was transferred to the X B track at gate B, while on the other hand, the bubbles continued on to the X B̄ C track at gate C. The bubbles 2 and 3 in each case propagated one element, as before.

Figure 3D:
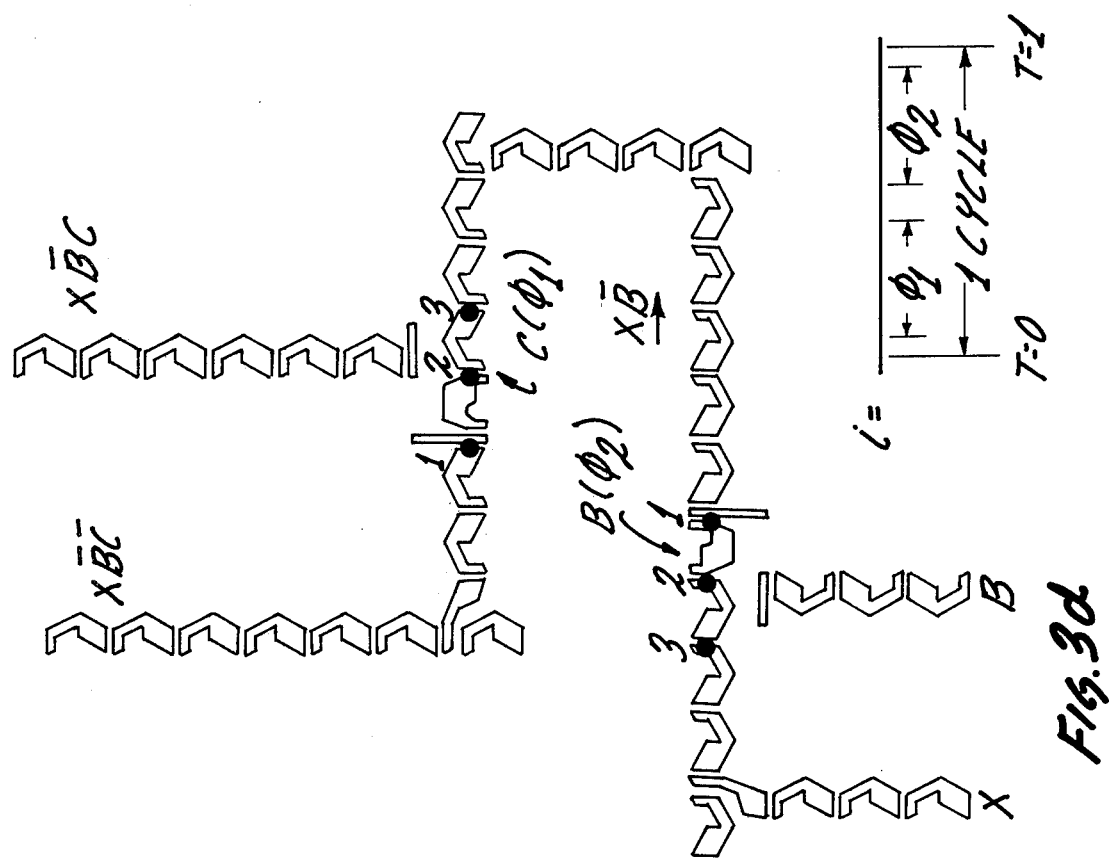

And finally, again, considering T=0 position of FIG. 3 and FIG. 3d, in conjunction with its accompanying timing diagram, where there is no pulse in either phase 1 or phase 2, this Figure shows bubbles propagating through the gate B onto track X B̄ and the bubbles at gate C propagating on to track X B̄ C̄. All bubbles propagating one element, as before.

From the foregoing, it can be seen that there is disclosed a phase controlled gating arrangement by which two gates oppositely oriented are controlled by one current conductor through the operation of a current pulse at different phases of the rotating in-plane magnetic field and while asymmetrical chevron propagate elements are disclosed, this invention may be used with other shapes of propagate elements and transfer gate elements with various shapes.

What is claimed is:

1. A phase controlled gating device on a magnetic bubble domain propagation structure which includes means capable of supporting magnetic domains thereon and which has propagate elements on which bubbles propagate element-to-element in response to a rotating in-plane magnetic field, said propagate elements defining bubble flow paths,
   a plurality of said propagate elements being transfer elements, oriented on said structure differently from each other and relative to different field directions of said rotating in-plane magnetic field,
   each said transfer elements being located in one flow path to receive bubbles therefrom and connected to two flow paths thus forming a gate by which bubbles from said input flow path will be directed to one of the two flow paths forming the output from said gate, and
   a single electrical conductor means coupled to said plurality of transfer elements to activate selected ones of said gates to direct said bubbles onto one of said output flow paths in response to the application of phased current pulse on said single electrical conductor means.

2. The phase controlled gating as claimed in claim 1, wherein said current pulse is applied at selected field directions of said rotating in-plane magnetic field which activates certain of said gates and not others depending on the orientation of said transfer elements.

3. The phase controlled gating as claimed in claim 2, wherein said electrical conductor means forms current loops at each gate, said current loops being oriented to correspond to the orientation of said transfer elements of said gates.

4. The phase controlled gating as claimed in claim 3, wherein said current loops are oriented 180° relative to one another so as to make said transfer elements responsive to pulses in a first field direction not responsive to pulses in a field direction oriented 180° to the first field direction.

5. The phase controlled gating as claimed in claim 4, wherein both output flow paths of one gate are connected to the input of another gate.

6. The phase controlled gating as claimed in claim 4, wherein one flow path is connected to a generator for generating magnetic bubbles which are propagated onto said one flow path to the input of one of said gates and wherein one output flow path of said one gate is connected to a means for annihilating said bubble means and wherein the other of said output flow paths is connected to the input of a following gate.

7. The phase controlled gating as claimed in claim 6, wherein one of the output flow paths from said gates is selected to be the true output and the other of said output flow paths is selected to be the inverted output.

8. The phase controlled gating as claimed in claim 7, wherein said transfer elements are chevron type elements which span the width of said current loops and wherein said current loops when subjected to a current pulse form negative and positive field directions in said structure which attract and repulse said bubbles in said transfer element thus directing said bubbles from the input flow path to a selected output flow path.

9. A phase controlled gating device on a magnetic bubble domain propagation structure which includes means capable of supporting magnetic domains thereon and which has propagate elements on which bubbles propagate element-to-element in response to a rotating in-plane magnetic field, said propagate elements defining bubble flow paths,
- a plurality of gates formed by selected propagate elements oriented on said structure differently from each other and relative to different field directions of said rotating in-plane magnetic field,
- each of said gate being located in one flow path to receive bubbles therefrom and connected to two flow paths to direct said bubbles to one of the two flow paths, and
- a single electrical conductor means coupled by hairpin loops to said gates to activate selected ones of said gates in response to the application of phased current pulses on said single electrical conductor means, the duration of each phased pulse being less than one cycle of said rotating in-plane magnetic field and occurring at a time in said cycle when said magnetic field corresponds to the orientation of the gates selected to be activated.

* * * * *